(12) United States Patent
Kwak

(10) Patent No.: US 7,268,601 B2
(45) Date of Patent: Sep. 11, 2007

(54) DELAY LOCKED LOOP AND CLOCK GENERATION METHOD THEREOF

(75) Inventor: Jong-Tae Kwak, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/880,120

(22) Filed: Jun. 28, 2004

(65) Prior Publication Data
US 2005/0093600 A1   May 5, 2005

(30) Foreign Application Priority Data
Oct. 30, 2003   (KR) ...................... 10-2003-0076265

(51) Int. Cl.
H03L 7/06 (2006.01)
(52) U.S. Cl. .................. 327/158; 327/161; 327/175
(58) Field of Classification Search ................ 327/149, 327/150, 158, 159, 161, 162, 172, 175
See application file for complete search history.

(56) References Cited

U.S. PATENT DOCUMENTS

| | | | |
|---|---|---|---|
| 5,614,855 A | 3/1997 | Lee et al. | |
| 5,757,218 A * | 5/1998 | Blum | 327/175 |
| 5,945,862 A | 8/1999 | Donnelly et al. | |
| 6,342,801 B1 | 1/2002 | Shin | |
| 6,384,652 B1 | 5/2002 | Shu | |
| 6,396,322 B1 | 5/2002 | Kim et al. | 327/158 |
| 6,452,432 B2 * | 9/2002 | Kim | 327/158 |
| 6,466,071 B2 | 10/2002 | Kim et al. | |
| 6,518,809 B1 | 2/2003 | Kotra | |
| 6,525,581 B1 * | 2/2003 | Choi | 327/175 |
| 6,603,337 B2 * | 8/2003 | Cho | 327/149 |
| 6,677,792 B2 * | 1/2004 | Kwak | 327/158 |
| 6,750,688 B2 * | 6/2004 | Takai | 327/158 |
| 6,765,421 B2 * | 7/2004 | Brox et al. | 327/175 |
| 6,853,225 B2 * | 2/2005 | Lee | 327/158 |
| 6,917,229 B2 * | 7/2005 | Cho | 327/158 |
| 6,934,215 B2 * | 8/2005 | Chung et al. | 365/233 |

(Continued)

FOREIGN PATENT DOCUMENTS

KR   1020010030308   4/2001

OTHER PUBLICATIONS

Jong-Tae Kwak, et al., "A Low Cost High Performance Register-Controlled Digital DLL for 1Gbps×32 . DDR SDRAM", 2003 Symposium on VLSI Circuits Digest of Technical Papers.

*Primary Examiner*—Kenneth B. Wells
*Assistant Examiner*—Hai L. Nguyen
(74) *Attorney, Agent, or Firm*—Blakely Sokoloff Taylor & Zafman

(57) ABSTRACT

A semiconductor device for correcting a duty of a clock signal includes a first clock buffer for receiving an external clock signal through a non-inverting terminal of the first clock buffer and for receiving an external clock bar signal through an inverting terminal of the first clock buffer to thereby output a first clock input signal; a second clock buffer for receiving the external clock bar signal through the non-inverting terminal of the first clock buffer and for receiving the external clock signal through the inverting terminal of the first clock buffer to thereby output a second clock input signal; and a delay locked loop (DLL) for receiving the first clock input signal and the second clock input signal to thereby generate a duty corrected clock signal.

5 Claims, 6 Drawing Sheets

U.S. PATENT DOCUMENTS 7,088,159 B2 * 8/2006 Kwak et al. ................ 327/161
2004/0062121 A1 4/2004 Chung et al.
2004/0066873 A1 4/2004 Cho et al.

* cited by examiner

DELAY LOCKED LOOP AND CLOCK GENERATION METHOD THEREOF

FIELD OF INVENTION

The present invention relates to a delay locked loop (DLL); and, more particularly, to an apparatus and a method for compensating a skew between an internal clock signal and an external clock signal and for correcting a duty error.

DESCRIPTION OF PRIOR ART

Generally, a delay locked loop (DLL) is used for a synchronous semiconductor memory device in order to synchronize an internal clock signal with an external clock signal. In the synchronous semiconductor memory device, data access operations such as a read operation and a write operation are performed in synchronization with rising and falling edges of the external clock signal.

Since there is a time delay while the external clock signal is inputted to the synchronous semiconductor memory device, the DLL is employed for synchronizing the internal clock signal with the external clock signal by compensating the time delay between the internal clock signal and the external clock signal.

However, in case of a double data rate (DDR) synchronous semiconductor memory device, the data access operations are performed at both of a rising edge and a falling edge of the internal clock signal. Therefore, it is required that the internal clock signal have a 50% of duty ratio.

Various techniques of the DLL have been introduced for compensating a clock skew between the internal clock signal and the external clock signal and for correcting a duty ratio.

For example, in an article by Jong-Tae Kwak et al., entitled "Low Cost High Performance Register-Controlled Digital DLL for 1 Gbps x32 DDR SDRAM", SOVC (Symposium On VLSI Circuits) (Jun. 9, 2003); a DLL is introduced for correcting the clock skew and the duty ratio by delaying the external clock signal using two delay lines.

FIG. 1 is a block diagram showing a conventional DLL disclosed in a commonly owned copending application, U.S. Ser. No. 10/331412, filed on Dec. 30, 2002, entitled "DIGITAL DLL APPARATUS FOR CORRECTING DUTY CYCLE AND METHOD THEREOF", which is incorporated herein by reference.

As shown, the conventional DLL includes a buffer 110, a delay line unit 120, a duty error controller 130, a first delay model unit 140, a first direct phase detector 150, a second delay model unit 160 and a second direct phase detector 170.

The buffer 110 receives an external clock signal ext_clk and generates a first internal clock signal which becomes activated at an edge of the first internal clock signal. The first internal clock signal is inputted to the delay line unit 120.

The delay line unit 120 receives the first internal clock signal and also receives a first and a second detection signals from the first and the second direct phase detectors 150 and 170. The delay line unit 120 delays the first internal clock signal based on the first and the second detection signals and outputs a first delayed internal clock signal intclk1 and a second delayed internal clock signal intclk2 to the duty error controller 130.

In detail, the delay line unit 120 includes a first controller 121, a first delay line 122, a second controller 123 and a second delay line 124.

For controlling a delay amount according to the first detection signal, the first controller 121 outputs a first control signal to the first delay line 122.

The first delay line 122 receives the first control signal and the first internal clock signal. The first internal clock signal is delayed according to the first control signal in the delay line 122. That is, the first delay line 122 generates the first delayed internal clock signal intclk1 by delaying the first internal clock signal according to the first control signal. The first delayed internal clock signal intclk1 is outputted to the duty error controller 130.

For controlling a delay amount according to the second detection signal, the second controller 123 outputs a second control signal to the second delay line 124.

The second delay line 124 receives the second control signal and the first internal clock signal. The second delay line 124 delays the first internal clock signal based on the second control signal. Then, the delayed first internal clock signal is inverted and outputted as the second delayed internal clock signal intclk2. The second delayed internal clock signal intclk2 is outputted to the duty error controller 130.

The duty error controller 130 receives the first and the second internal clock signals intclk1 and intclk2. The duty error controller 130 generates a first duty controlled clock signal int_clk and a second duty controlled clock signal intclk2' by shifting falling edges of the first and the second duty controlled clock signals int_clk and intclk2' to a middle of the falling edges of the first and the second duty controlled clock signals int_clk and intclk2'. Herein, after the first and the second duty controlled clock signals int_clk and intclk2' are duty corrected by shifting their falling edges as above mentioned, they have a 50% duty ratio. The first and the second duty controlled clock signals int_clk and intclk2' are respectively outputted to the first and the second delay model units 140 and 160.

The duty error controller 130 includes a first phase detector 131, a mixer controller 132, a first phase mixer 133 and a second phase mixer 134.

The first and the second delayed internal clock signals intclk1 and intclk2 are inverted and inputted to the first phase detector 131. The first phase detector 131 compares phases of falling edges of the first and the second delayed internal clock signals intclk1 and the intclk2 for determining which one of their falling edges leads the other; and, then, generates a phase detection signal based on the comparison result. The phase detection signal is outputted to the mixer controller 132.

The mixer controller 132 receives the phase detection signal to determine a weight k, which contains a difference between two falling edges of the first and the second delayed internal clock signals intclk1 and intclk2, according to the phase detection signal. The weight k is outputted to the first and the second phase mixers 133 and 134. The weight k includes the plural number of weight signals.

The first phase mixer 133 receives the weight k, the first and the second delayed internal clock signals intclk1 and intclk2. The first phase mixer 133 calculates a difference value by subtracting the weight k from 1. By applying the difference value to the first delayed internal clock signal intclk1 and applying the weight k to the second delayed internal clock signals intclk2, the first phase mixer 133 generates a first duty controlled clock signal int_clk. The first duty controlled clock signal int_clk is outputted to the first delay model unit 140.

The second phase mixer 134 receives the weight k and calculates a difference value by subtracting the weight k from 1. The second phase mixer 134 generates a second duty controlled clock signal intclk2' by applying the weight k to the first delayed internal clock signal intclk1 and applying the difference value to the second delayed internal clock signal intclk2. The second phase mixer 134 outputs the second duty controlled clock signal intclk2' to the second delay model unit 160.

Herein, as mentioned above, the first and the second duty controlled clock signals int_clk and intclk2' are generated by shifting their falling edges to a middle of their falling edges; and a direction and a amount of the shift is determined by the weight k and the difference value.

The first delay model unit 140 receives the first duty controlled clock signal int_clk and estimates a delay amount generated while the external clock signal ext_clk is passed through the conventional DLL to be outputted as the first and the second duty controlled clock signals int_clk and intclk2'. The first delay model unit 140 generates a first compensated clock signal iclk1 based on the estimated delay amount and outputs the first compensated clock signal iclk1 to the first direct phase detector 150.

The first direct phase detector 150 receives the external clock signal ext_clk and generates the first detection signal by comparing the external clock signal ext_clk with the first compensated clock signal iclk1. The first direct phase detector 150 outputs the first detection signal to the delay line unit 120.

The second delay model unit 160 receives the second duty controlled clock signal intclk2' and estimates a delay amount generated while the second duty controlled clock signal intclk2' travels to a data input/output pin (DQ pin). The second delay model unit 160 generates a second compensated clock signal iclk2 based on the estimated delay amount and outputs the second compensated clock signal iclk2 to the second direct phase detector 170.

The second direct phase detector 170 receives the external clock signal ext_clk and generates the second detection signal by comparing the external clock signal ext_clk and the second compensated clock signal iclk2. The second direct phase detector 170 outputs the second detection signal to the delay line unit 120.

FIG. 2 is a timing diagram showing operations of the conventional DLL shown in FIG. 1.

The operations of the conventional DLL are described below referring to FIGS. 1 and 2.

At first, if the external clock signal ext_clk is inputted to the buffer 110, the buffer 110 outputs the first internal clock signal. The delay unit 120 creates the first and the second delayed internal clock signals intclk1 and intclk2 by delaying the internal clocks signal. As shown in FIG. 2, a rising edge of the first delayed internal clock signal intclk1 is synchronized with that of the second delayed internal clock signal intclk2, but a falling edge of the first delayed internal clock signal intclk1 is not synchronized with that of the second delayed internal clock signal intclk2 causing a duty error.

The first and the second delayed internal clock signals intclk1 and intclk2 are inputted to the first phase detector 131 and the first phase detector 131 detects a phase difference between the first and the second delayed internal clock signals intclk1 and intclk2. A mixer controller 132 receives the phase difference and generates the weight k based on the phase difference for shifting the falling edges of the first delayed internal clock signal intclk1 and the second delayed internal clock signal intclk2. That is, the weight k is controlled for shifting two falling edges of the first delayed internal clock signal intclk1 and the second delayed internal clock signal intclk2 to a middle of two falling edges of the intclk1 and the intclk2.

Referring to FIG. 2, more weight needs to be given to the second delayed internal clock signal intclk2 than the first delayed internal clock signal intclk1 for compensating the phase difference of two falling edges of the first and the second delayed internal clock signals intclk1 and intclk2. In a case that a high clock pulse width of the first internal clock signal intclk1 is wider than that of the second internal clock signal intclk2 as shown in FIG. 2, the weight given to the second delayed internal clock signal intclk2 is larger than 0.5.

A value of the weight k is initially set to 0 and it gradually increases little by little from a timing when rising edges of the first compensated clock signal iclk1 and the second compensated clock signal iclk2 are synchronized with a rising edge of the external clock signal ext_clk. Whenever the weight k increases, the falling edge of the first duty controlled clock signal int_clk outputted from the first phase mixer 133 is shifted to the middle of the two falling edges of the first and the second delayed internal clock signals intclk1 and intclk2 little by little and a falling edge of the second duty controlled clock signal intclk2' outputted from the second phase mixer 134 is also shifted to the middle of the two falling edges of the intclk1 and the intclk2 little by little. By above mentioned operations, each of the first and the second duty controlled clock signals int_clk and intclk2' has 50% of a duty ratio.

As mentioned above, for shifting the falling edges of the first and the second delayed internal clock signals intclk1 and intclk2 at the first and the second phase mixers 133 and 134 when a high clock pulse width of the first internal clock signal intclk1 is wider than that of the second internal clock signal intclk2 as shown in FIG. 2, the weight value more than 0.5 must be given to the second delayed internal clock signal intclk2. If the falling edge of the second delayed internal clock signal intclk2 is preceded by the rising edge of the first delayed internal clock signal intclk1, the weight k of the first phase mixer 133 may be set up as 0.6 and the weight k of the second phase mixer 134 may be set up as 0.4.

In the above-mentioned case, if a weight applied to the second delayed internal clock signal intclk2 is 0.6, a weight applied to the first delayed internal clock signal intclk1 is 0.4 (=1−0.6). Likewise, in the second phase mixer 134, if a weight applied to the first delayed internal clock signal intclk1 is 0.4, a weight applied to the second delayed internal clock signal is 0.6 (=1−0.4). In the above-mentioned case, since the rising edges of the first and the second delayed internal clock signals intclk1 and intclk2 have identical phase, the rising edges of the first and the second delayed internal clock signals intclk1 and intclk2 are not compensated. However, if the rising edges of the first and the second delayed internal clock signals intclk1 and inclk2 are different, then they are compensated to synchronize the two falling edges.

FIG. 3 is a schematic circuit diagram showing output terminals of the first and the second delay lines 122 and 124.

As shown, two and three serially connected inverters are respectively coupled to the output terminals of the first and the second delay lines 122 and 124.

As mentioned above, the first and the second delayed internal clock signals intclk1 and intclk2 have an opposite phase when they are generated by the first and the second delay lines 122 and 124, i.e., if a duty ratio of the first delayed internal clock signal intclk1 is 60%, a duty ratio of the second delayed internal clock signal intclk2 is 40%.

However, due to some variations of the inverters connected to the output terminals of the first and the second delay lines 122 and 124, e.g., a manufacturing process, a voltage and a temperature, the first and the second delayed internal clock signals intclk1 and intclk2 may not have opposite duties. Therefore, a performance of the conventional DLL can be degraded due to the above-mentioned problem.

SUMMARY OF INVENTION

It is, therefore, an object of the present invention to provide a DLL and a method for synchronizing an internal clock signal with an external clock signal and for correcting a duty ratio of the internal clock signal.

In accordance with an aspect of the present invention, there is provided a semiconductor device including a first clock buffer for receiving an external clock signal through a non-inverting terminal of the first clock buffer and for receiving an external clock bar signal through an inverting terminal of the first clock buffer to thereby output a first clock input signal; a second clock buffer for receiving the external clock bar signal through the non-inverting terminal of the first clock buffer and for receiving the external clock signal through the inverting terminal of the first clock buffer to thereby output a second clock input signal; and a delay locked loop (DLL) for receiving the first clock input signal and the second clock input signal to thereby generate a duty corrected clock signal.

In accordance with another aspect of the present invention, there is provided a DLL device including a first clock buffer for receiving an external clock signal through a non-inverting terminal of the first clock buffer and for receiving an external clock bar signal through an inverting terminal of the first clock buffer to thereby output a first clock input signal; a second clock buffer for receiving the external clock bar signal through the non-inverting terminal of the first clock buffer and for receiving the external clock signal through the inverting terminal of the first clock buffer to thereby output a second clock input signal; a delay line unit which receives the first clock input signal and the second clock input signal for generating a first delayed clock signal and a second delayed clock signal by delaying the first clock input signal and the second clock input signal based on a first comparison signal and a second comparison signal; a duty correction unit which receives the first delayed clock signal and the second delayed clock signal for generating a first duty corrected clock signal and a second duty corrected clock signal by moving falling edges of the first delayed clock signal and the second delayed clock signal to a middle of the falling edges of the first delayed clock signal and the second delayed clock signal; a first delay model unit for estimating a delay amount generated while the first duty corrected signal is passed to a data input/output pin and for outputting a first compensated clock signal by compensating the first duty corrected signal based on the estimated delay amount; a first direct phase detector for generating the first comparison signal by comparing the first clock input signal with the first compensated clock signal; a second delay model unit for estimating a delay amount generated while the second duty corrected signal is passed to the data input/output pin and for outputting a second compensated clock signal by compensating the second duty corrected signal based on the estimated delay amount; and a second direct phase detector for generating the second comparison signal by comparing the first clock input signal with the second compensated clock signal;

In accordance with further another aspect of the present invention, there is provided a method for generating a duty corrected clock signal including a step of generating a first clock input signal by buffering an external clock signal which is inputted through a non-inverting terminal and buffering an external clock bar signal which is inputted through an inverting terminal; generating a second clock input signal by buffering the external clock bar signal which is inputted through the non-inverting terminal and buffering the external clock signal which is inputted through the inverting terminal; and generating the duty corrected clock signal by synchronizing rising edges of the first clock input signal and the second clock input signal and moving their falling edges to a middle of their falling edges.

In accordance with further another aspect of the present invention, there is provided a method for generating a duty corrected clock signal including a step of generating a first clock input signal by buffering an external clock signal which is inputted through a non-inverting terminal and buffering an external clock bar signal which is inputted through an inverting terminal; generating a second clock input signal by buffering the external clock bar signal which is inputted through the non-inverting terminal and buffering the external clock signal which is inputted through the inverting terminal; generating a first delayed clock signal and a second delayed clock signal by buffering the first clock input signal and the second clock input signal; generating a first duty corrected clock signal and a second duty corrected clock signal by moving falling edges of the first delayed clock signal and the second delayed clock signal to a middle of the falling edges; generating a first compensated clock signal by compensating a delay amount of the first duty corrected clock signal which is generated while the first duty corrected clock signal is passed to a data input/output pin; generating a first comparison signal by comparing the first clock input signal with the first compensated clock signal; generating a second compensated clock signal by compensating a delay amount of the second duty corrected clock signal which is generated while the second duty corrected clock signal is passed to the data input/output pin; and generating a second comparison signal by comparing the second clock input signal with the second compensated clock signal;

In accordance with further another aspect of the present invention, there is provided a semiconductor memory device including a first clock buffer for receiving an external clock signal through a non-inverting terminal of the first clock buffer and for receiving an external clock bar signal through an inverting terminal of the first clock buffer to thereby output a first clock input signal; a second clock buffer for receiving the external clock bar signal through the non-inverting terminal of the first clock buffer and for receiving the external clock signal through the inverting terminal of the first clock buffer to thereby output a second clock input signal; and a delay locked loop which receives the first clock input signal and the second clock input signal for correcting a duty of the external clock signal.

In accordance with further another aspect of the present invention, there is provided a method for generating a duty corrected clock signal including a step of generating a first clock input signal by buffering an external clock signal which is inputted through a non-inverting terminal and buffering an external clock bar signal which is inputted through an inverting terminal; generating a second clock input signal by buffering the external clock bar signal which is inputted through the non-inverting terminal and buffering the external clock signal which is inputted through the inverting terminal; and correcting a duty of the external clock signal by using the first clock input signal and the second clock input signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop (DLL) in accordance with the present invention will be described in detail referring to the accompanying drawings.

Figure 1:
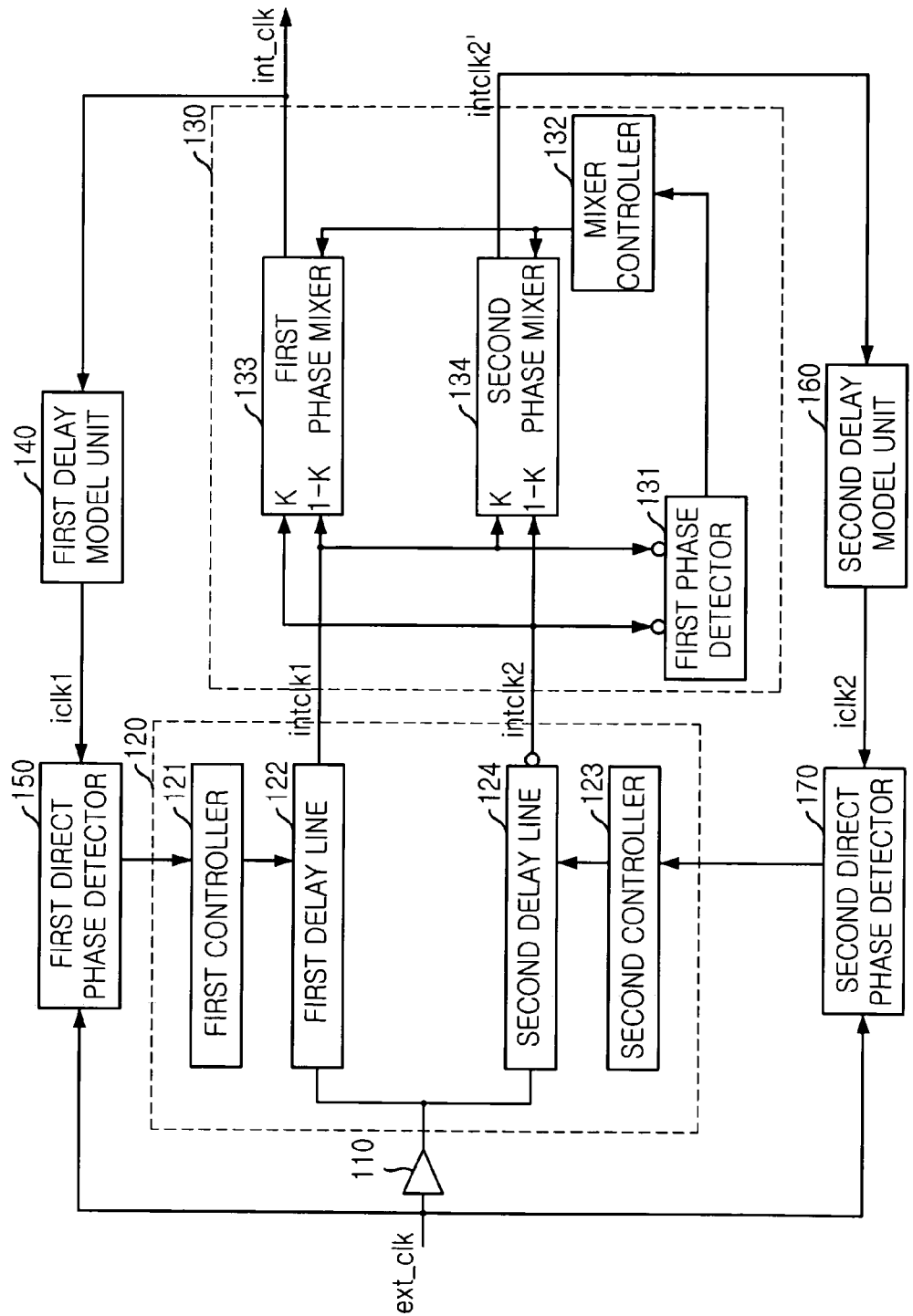
FIG. 1 is a block diagram showing a conventional DLL.
Figure 2:
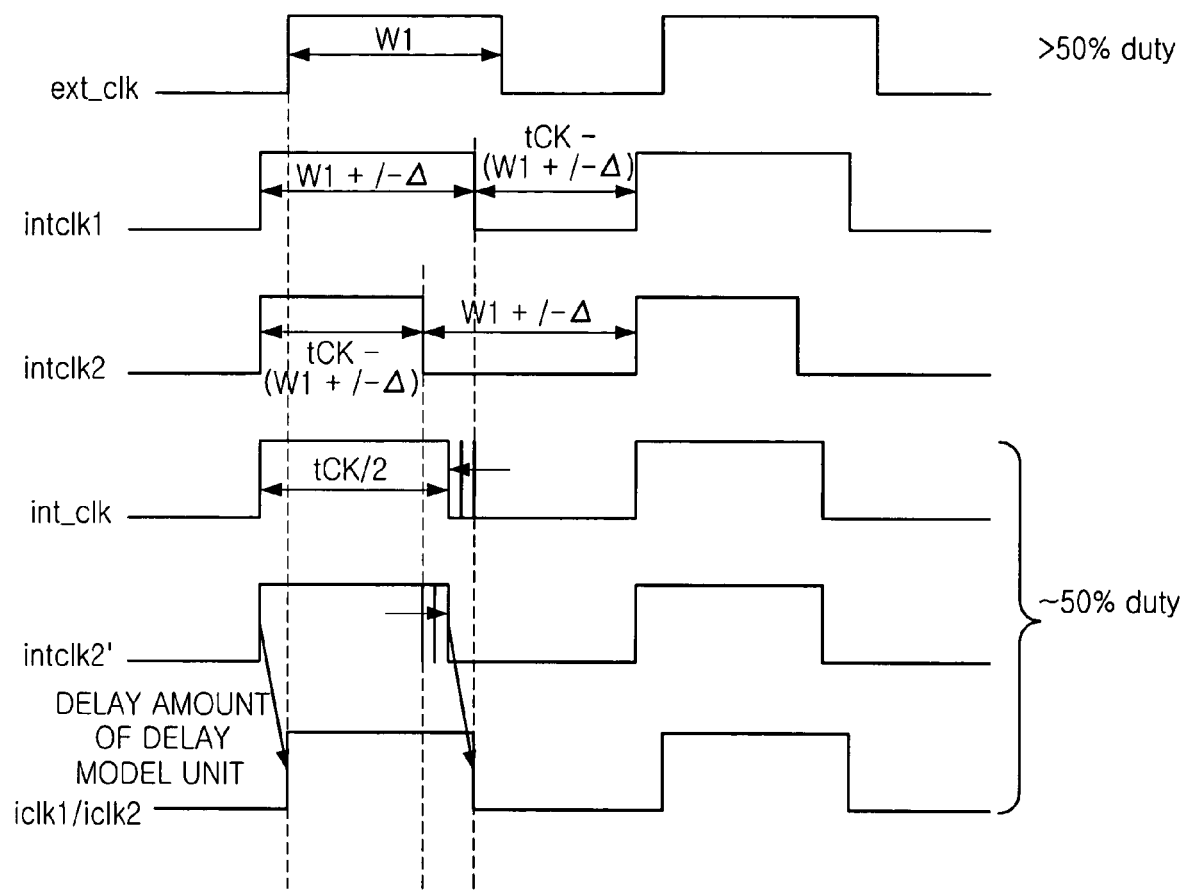
FIG. 2 is a timing diagram showing operations of the conventional DLL shown in FIG. 1.
Figure 3:
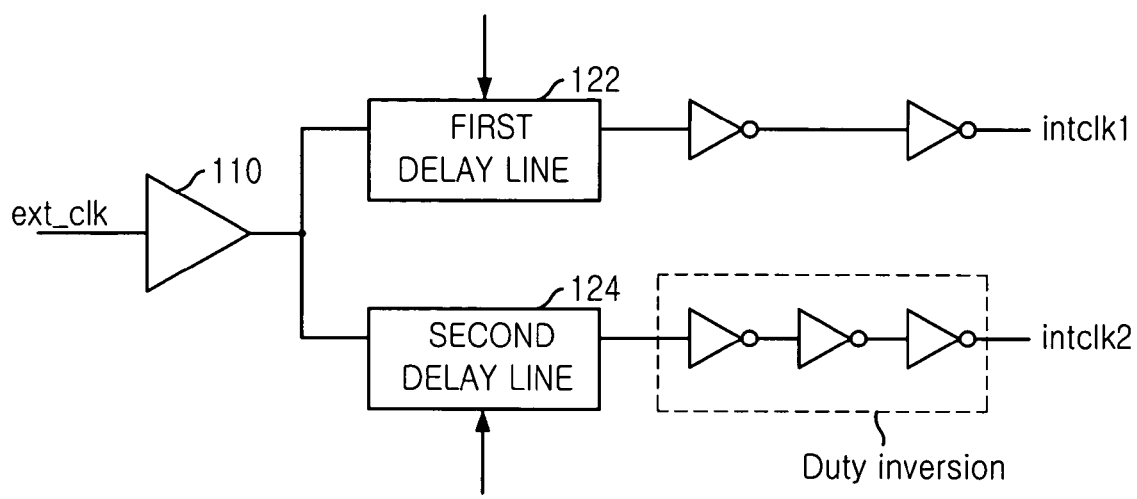
FIG. 3 is a schematic circuit diagram showing output terminals of a first and a second delay lines shown in FIG. 1.
Figure 4:
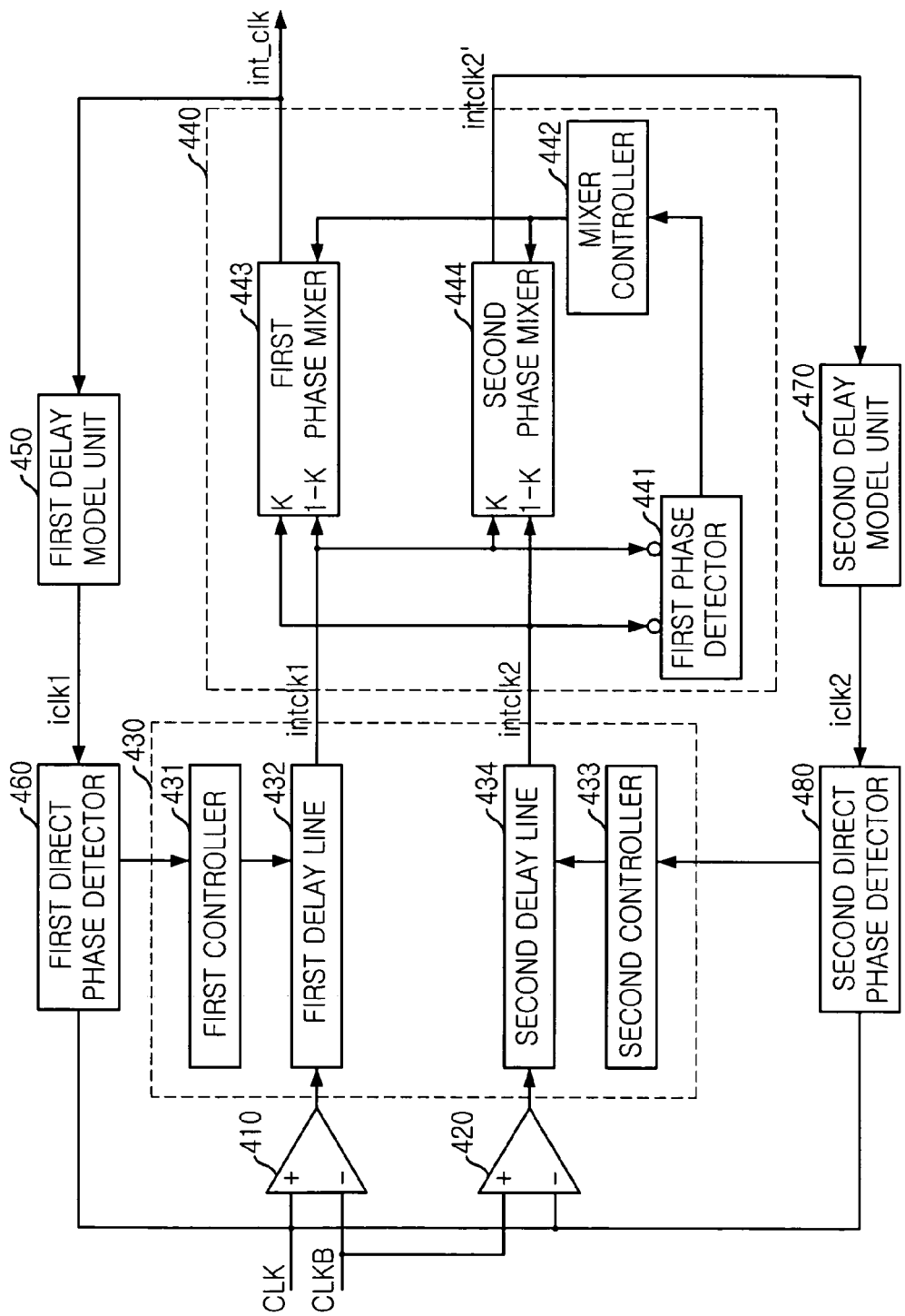
FIG. 4 is a block diagram showing a DLL in accordance with a preferred embodiment of the present invention.

FIG. 4 is a block diagram showing the DLL in accordance with a preferred embodiment of the present invention.

As shown, the DLL includes a first clock buffer 410, a second clock buffer 420, a delay line unit 430, a duty error controller 440, a first delay model unit 450, a second delay model unit 470, a first direct phase detector 460 and a second direct phase detector 480.

The delay line unit 430 includes a first controller 431, a first delay line 432, a second controller 433 and a second delay line 434; and the duty error controller 440 includes a first phase mixer 443, a second phase mixer 444, a mixer controller 442 and a first phase detector 441.

Operations and structures of the delay line unit 430, the duty error controller 440, the first delay model unit 450, the second delay model unit 470, the first direct phase detector 460 and the second direct phase detector 480 are the same as those of the conventional DLL.

However, the DLL in accordance with the present invention includes two clock buffers for receiving an external clock signal, and an output terminal of the second delay line 434 does not includes an inverter.

Each of the first and the second clock buffers 410 and 420 receives an external clock signal CLK and its inverted signal, namely, an external clock bar signal CLKB for generating a first clock input signal and a second clock input signal by buffering the received signals. Herein, the first and the second clock buffers 410 and 420 are identical.

The first clock buffer 410 receives the external clock signal CLK and the external clock bar signal CLKB through its non-inverting terminal (+) and an inverting terminal (−) respectively to output the first clock input signal. On the other hand, the second clock buffer 420 receives the external clock signal CLK and the external clock bar signal CLKB through its inverting terminal (−) and a non-inverting terminal (+) respectively. Therefore, a duty of the first clock input signal is opposite to that of the second clock input signal, e.g., if the duty of the first clock input signal 60%, then the duty of the second clock input signal is 40%.

Meanwhile, the external clock signal CLK and the external clock bar signal CLKB are differential clock signals generated by a chipset and are inputted to a semiconductor memory device. Since the external clock signal CLK and the external clock bar signal CLKB are differential clock signals, their phases are always opposite.

Therefore, rising edges of a first and a second delayed internal clock signals intclk1 and intclk2 generated by the first and the second delay line 432 and 434 are synchronized, and a duty of the first delayed clock signal intclk1 is opposite to that of the second delayed clock signal intclk2 regardless of variations of a manufacturing process, a voltage or a temperature.

Thereafter, a first and a second duty corrected clock signals int_clk and intclk2' having 50% of duty can be generated by the duty error controller 440.

Figure 5:
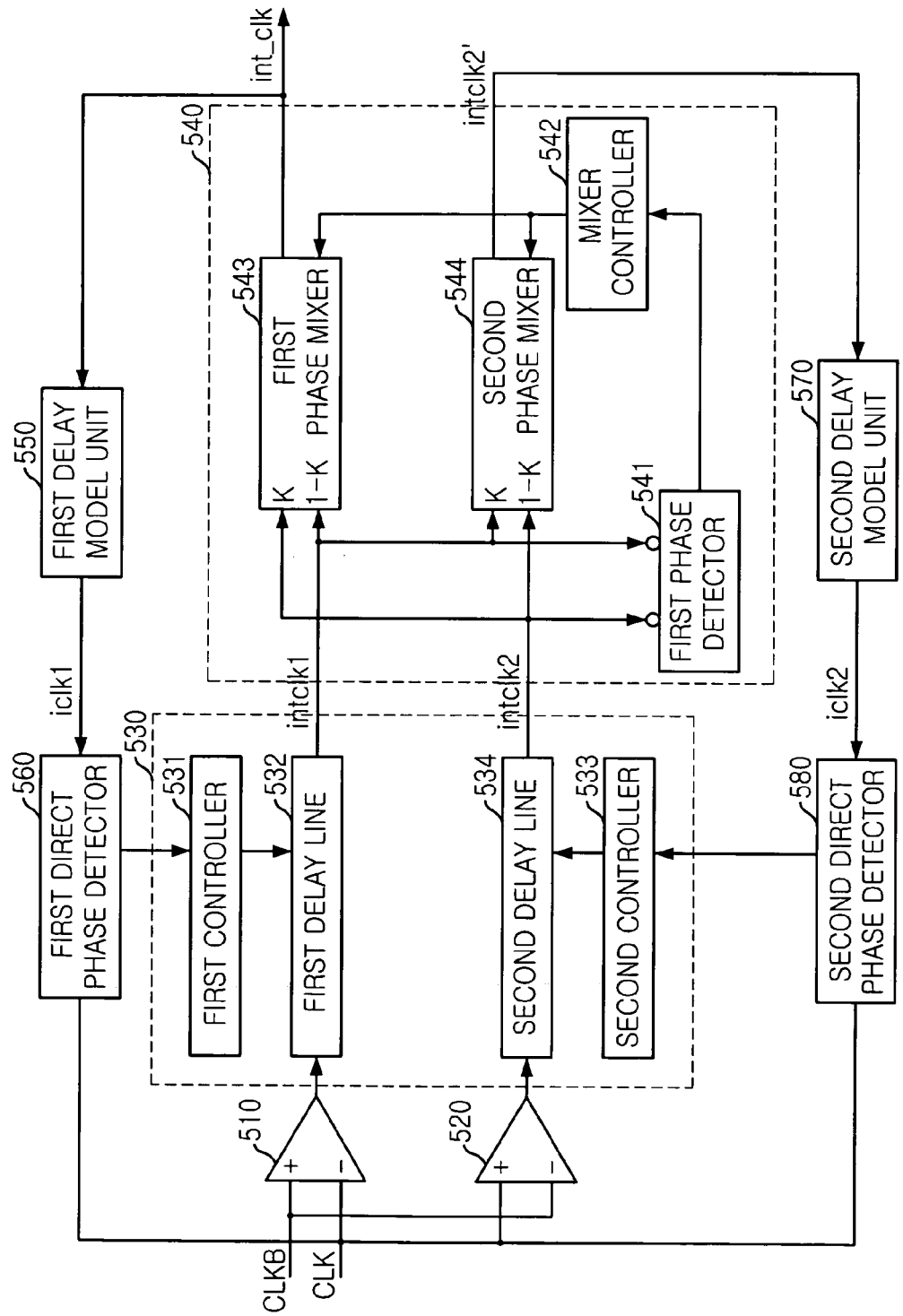
FIG. 5 is a block diagram showing a DLL in accordance with another embodiment of the present invention.

FIG. 5 is a block diagram showing a DLL in accordance with another embodiment of the present invention.

As shown, a structure of the DLL shown in FIG. 5 is the same as that of the DLL shown in FIG. 4.

However, unlike the DLL shown in FIG. 4, a first clock buffer 510 receives the external clock bar signal CLKB through its non-inverting terminal and also receives the external clock signal CLK through its inverting terminal. Undoubtedly, an operation of the DLL shown in FIG. 5 is the same as that of the DLL shown in FIG. 4.

Figure 6:
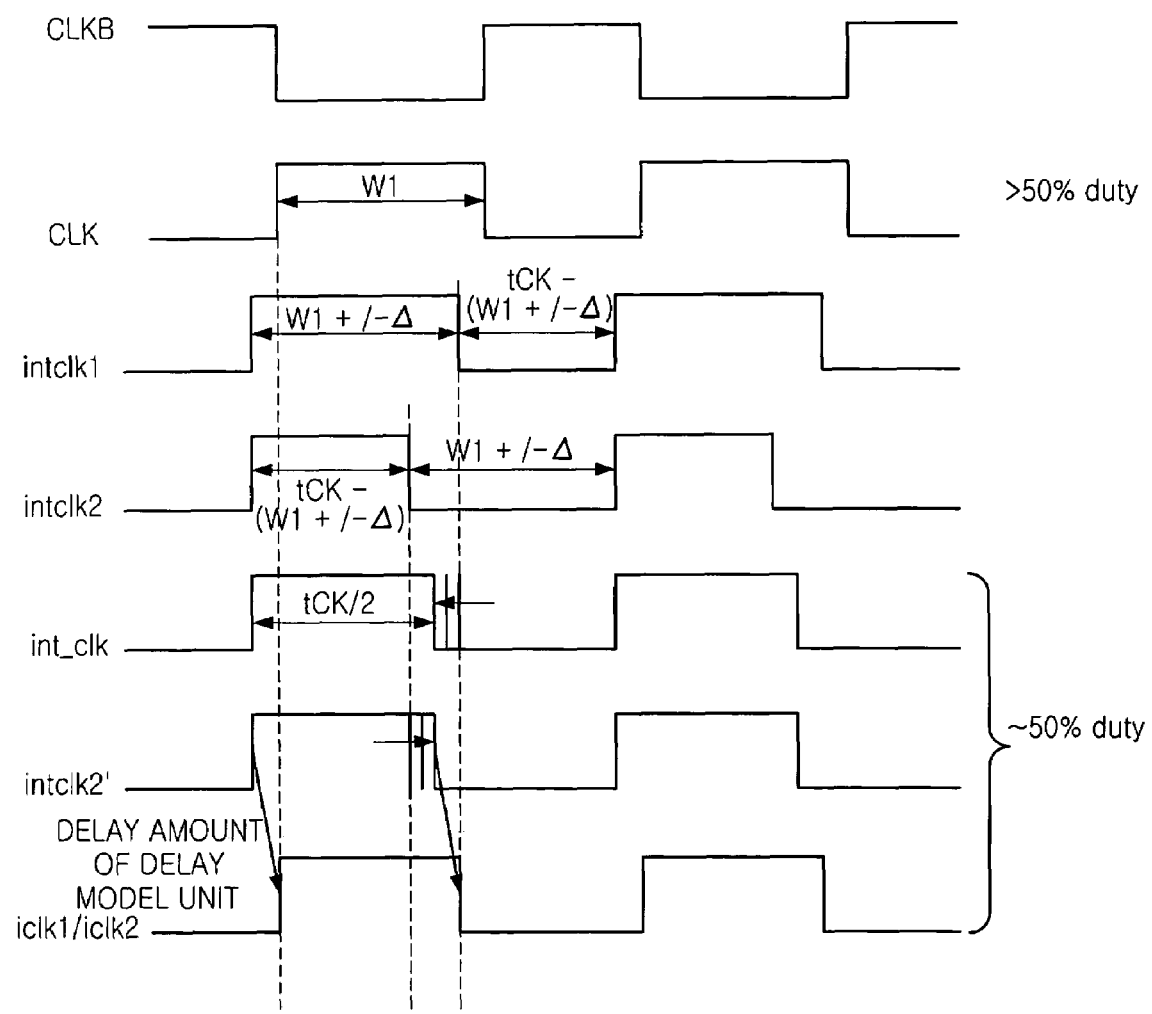
FIG. 6 is a timing diagram showing operations of DLLs shown in FIGS. 4 and 5.

FIG. 6 is a timing diagram showing operations of the DLLs shown in FIGS. 4 and 5.

As shown, if the external clock signal CLK and the external clock bar signal CLKB having opposite duties are inputted, the first and the second delayed internal clock signals intclk1 and intclk2 having opposite duties are generated. Thereafter, a duty of the external clock signal CLK is corrected to have 50% of duty by using the first and the second delayed internal clock signals intclk1 and intclk2.

In accordance with further another embodiment, an output signal from the first clock buffer 410 shown in FIG. 4 can be inputted to the first and the second direct phase detectors 460 and 480 instead of the external clock signal CLK.

Likewise, in accordance with further another embodiment, an output signal from the second clock buffer 520 shown in FIG. 5 can be inputted to the first and the second direct phase detectors 560 and 580.

In addition, the first and the second clock buffers shown in FIGS. 4 and 5 can be placed out of the DLLs shown in FIGS. 4 and 5.

As described above, in accordance with the present invention, two clock signals having opposite duties can be generated for correcting duty of a clock signal regardless of variations of a manufacturing process, a voltage or a temperature. In addition, two delay lines included in the DLL in accordance with the present invention have the same structure not coupling inverters to their output terminals; and, thus more accurately corrected clock signals can be generated. Therefore, a performance of a DLL can be increased by using the DLL in accordance with the present invention.

The present application contains subject matter related to Korean patent application No. 2003-76265, filed in the Korean Patent Office on Oct. 30, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An apparatus for correcting a duty cycle of a clock signal, comprising:

a first clock buffer for receiving an external clock signal through a non-inverting terminal of the first clock buffer and for receiving an external clock bar signal through an inverting terminal of the first clock buffer to thereby output a first internal clock signal;

a second clock buffer for receiving the external clock bar signal through the non-inverting terminal of the second clock buffer and for receiving the external clock signal through the inverting terminal of the second clock buffer to thereby output a second internal clock signal;

a delay line unit for receiving the first and second internal clock signals from the clock buffers, a first detection signal and a second detection signal to output a first delayed internal clock signal by delaying the first internal clock signal according to the first detection signal, and a second delayed internal clock signal by delaying the second internal clock signal according to the second detection signals;

a duty error controller for receiving the first and second delayed internal clock signals and outputting a first duty controlled clock signal and second duty controlled clock signal by shifting each edge of the first and second delayed internal clock signals in order to match;

a first delay model unit for receiving the first duty controlled clock signal which travels to a data input/output pin to output a first compensated clock signal by compensating for a difference between the external clock signal and the first duty controlled clock signal;

a first direct phase detector for receiving the external clock signal, generating a first detection signal by comparing the external clock signal and the first compensated clock signal and outputting the first detection signal to the delay line unit;

a second delay model unit for receiving the second duty controlled clock signal which travels to a data input/output pin to output a second compensated clock signal by compensating for a difference between the external clock signal and the second duty controlled clock signal; and a second direct phase detector for generating a second detection signal by comparing the external clock signal and the second compensated clock signal and outputting the second detection signal to the delay line unit.

2. The apparatus as recited in the claim 1, wherein the delay line unit comprises:

a first controlling means for generating a first control signal for controlling a delay amount according to the first detection signal;

a first delay line for receiving the first control signal and the first internal clock signal to generate the first delayed internal clock signal by delaying the first internal clock signal according to the first control signal;

a second controlling means for generating a second control signal for controlling a delay amount according to the second detection signal; and a second delay line for receiving the second control signal and the second internal clock signal to generate the second delayed internal clock signal by delaying the second internal clock signal according to the second control signal.

3. The apparatus as recited in claim 1, wherein the duty error controller includes:

a first phase detector for receiving the first delayed internal clock signal and the second delayed internal clock signal to generate a phase detect signal by selecting one signal having a preceded falling edge of the first delayed internal clock signal and second delayed internal clock signal;

a mixer controller for determining a plural number of weights according to the phase detect signal and outputting the plural number of weights;

a first phase mixer for generating a first duty controlled clock signal by receiving the weight and outputting the first duty controlled clock signal to the first delay model unit, wherein the first duty controlled clock signal is created by applying a value of subtracting the weight from 1 to the first delayed internal clock signal, applying the weight to the second delayed internal clock signal; and a second phase mixer for generating a second duty controlled clock signal by receiving the weight and outputting the second duty controlled clock signal to the second delay model unit, wherein the second duty controlled clock signal is created by applying the weight to the first delayed internal clock signal and applying a value of subtracting the weight from 1 to the second delayed internal clock signal.

4. A method for generating a duty corrected clock signal by using a delay locked loop (DLL), comprising:

a) generating a first clock input signal by buffering an external clock signal which is inputted through a non-inverting terminal and buffering an external clock bar signal which is inputted through an inverting terminal;

b) generating a second clock input signal by buffering the external clock bar signal which is inputted through the non-inverting terminal and buffering the external clock signal which is inputted through the inverting terminal;

c) determining whether rising edges of an external clock signal are matched with rising edges of a first compensated clock signal and a second compensated clock signal to thereby generate a first delayed internal clock signal and a second delayed internal clock signal by delaying the first clock input signal and the second clock input signal, respectively;

d) selecting one signal of the first delayed internal clock signal and the second delayed internal clock signal having a preceded falling as between the first delayed internal clock signal and the second delayed internal clock signal in case that the rising edges are matched; and e) applying a first value larger than or equal to 0 and less than 0.5 to the one of the first delayed internal clock signal and the second delayed internal clock signal, which is not selected at step b) and applying a second value greater than 0.5 and less than or equal to 1 to the one of the first delayed internal clock signal and the second delayed internal clock signal, which is selected at step b).

5. The method as recited in claim 4, further comprising:

f) controlling a delay amount for matching the rising edges in case that the rising edges are not matched.

* * * * *